United States Patent
Amini et al.

(10) Patent No.: US 6,210,594 B1
(45) Date of Patent: *Apr. 3, 2001

(54) NEAR SUBSTRATE REACTANT HOMOGENIZATION APPARATUS

(75) Inventors: Zabra H. Amini, Cupertino, CA (US); Robert B. Campbell, Tijeras, NM (US); Robert L. Jarecki, Jr.; Gary D. Tipton, both of Albuquerque, NM (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/031,130

(22) Filed: Feb. 26, 1998

Related U.S. Application Data

(62) Division of application No. 08/508,724, filed on Jul. 28, 1995, now Pat. No. 5,938,943.

(51) Int. Cl.⁷ ................................................ H05H 1/00
(52) U.S. Cl. ................................................ 216/67; 156/345
(58) Field of Search ....................... 156/345; 118/723 R, 118/723 E, 728; 216/67, 58

(56) References Cited

U.S. PATENT DOCUMENTS

| | | | |
|---|---|---|---|
| 4,350,578 | 9/1982 | Frieser et al. | 204/192 R |
| 4,786,359 | 11/1988 | Stark et al. | 156/643 |
| 4,793,975 | 12/1988 | Drage | 422/186.05 |
| 4,842,683 | 6/1989 | Cheng et al. | 156/345 |
| 5,238,499 * | 8/1993 | van de Ven et al. | 118/728 |
| 5,356,476 | 10/1994 | Foster et al. | 118/725 |
| 5,384,008 * | 1/1995 | Sinha et al. | 156/345 |
| 5,415,728 | 5/1995 | Hasegawa et al. | 156/643.1 |
| 5,474,649 * | 12/1995 | Kava et al. | 216/67 |
| 5,498,313 * | 3/1996 | Bailey et al. | 156/345 |

FOREIGN PATENT DOCUMENTS

| | | | |
|---|---|---|---|
| 61-39520 | 2/1986 | (JP) | H01L/21/302 |
| 62-47130 | 2/1987 | (JP) | H01L/21/302 |
| 5-243190 | 9/1993 | (JP) | H01L/21/302 |

* cited by examiner

*Primary Examiner*—Thi Dang
(74) *Attorney, Agent, or Firm*—Townsend and Townsend amd Crew

(57) ABSTRACT

A near substrate reactant homogenization apparatus reduces the excess reactive species in a region at or near the edge of a substrate surface to provide a uniform reactant concentration over the substrate, thereby improving etch rate uniformity over the substrate. The near substrate reactant homogenization apparatus has a substantially planar surface that is parallel to said substrate surface and that extends beyond the substrate edge, at or below the substrate surface. In a first preferred embodiment of the invention, the temperature of the gas absorber area is changed to promote recombination or condensation of excess reactive species at the substrate edge, where the excess species are removed. In another, equally preferred embodiment of the invention, the gas absorber area is formed of a porous material having a large surface area. Excess reactive species enter the porous structure and are subsequently recombined. In a third equally preferred embodiment of the invention, a gas curtain of a laminar inert or reactive gas may also be used along the substrate surface perimeter, either alone or in conjunction with the first or second embodiments of the invention, to form a diffusive barrier that suppresses the flux of excess reactive species at the substrate's edge.

24 Claims, 3 Drawing Sheets

NEAR SUBSTRATE REACTANT HOMOGENIZATION APPARATUS

This is a divisional of application Ser. No. 08/508,724 filed on Jul. 28, 1995, now U.S. Pat. No. 5,938,943.

BACKGROUND OF THE INVENTION

1. Technical Field

The invention relates to substrate fabrication. More particularly, the invention relates to an apparatus and method for providing a uniform distribution of reactive species over a substrate.

2. Description of the Prior Art

During the fabrication of integrated circuits on a silicon wafer, the wafer is coated with a photoresist mask, portions of which are exposed to light and developed to form a pattern on the wafer surface. A plasma containing a reactive gas is then applied to etch the coated wafer. The steps of coating, patterning, and etching may be repeated several times during the fabrication process.

FIG. 1 is a diagram showing the concentration of reactive species during substrate etching relative to the surface of a semiconductor wafer. Reactive species generated from a process gas are applied to the surface of a silicon wafer to expose portions of the wafer surface not coated with a photoresist to the reactive species, such that a desired pattern is etched into the wafer surface.

The etching rate increases with the concentration of reactive species. Due to consumption of reactive species at the wafer surface, the flux of this material has a non-uniform distribution over the etching surface, as shown by the lines identified by the numeric designators 110 and 120. Thus, a region of uniformity 140 occurs toward the center of the wafer 220, while a region of non-uniformity 180 containing excess reactive species occurs toward the edge 160 of the wafer. The region of non-uniformity typically has an increased etch rate.

It is important to maintain a uniform etch rate over the surface of the wafer to ensure the accurate patterning of the wafer surface. Reduction of reactive species at the wafer's edge is one way to achieve this uniformity. The prior art method for reducing this excess reactive species radial flux is to use a focus ring 225 surrounding the wafer, as is shown in FIG. 2. The focus ring forms a diffusive barrier that suppresses the flux of excess reactive species at the wafer's edge.

There are, however, several significant problems arising from the use of a focus ring. The focus ring can introduce contamination during the etching process that may degrade the wafer etching yields, and the subsequent performance of the integrated circuits thus produced. For example, the focus ring itself can react with the reactive species and provide a surface for deposition of by-product. Further, delamination of the films could occur due to poor thermal control and plasma exposure.

Another problem encountered with use of a focus ring is that it makes the insertion and removal of wafers more complex. This slows down the manufacturing process, adding to the cost of production. Further, the likelihood of mishandling and damaging wafers is also increased. It has also been noted that the use of a focus ring distorts the plasma sheath because the electrical field must be perpendicular to the surfaces of the focus ring.

It is also known to use an absorbing annulus to reduce excess reactive species flux. An absorbing annulus is a virtual wafer placed around the periphery of a substrate that is undergoing etching. The absorbing annulus simulates a wafer, thereby consuming excess reactive species, and thereby providing a more uniform etch rate. Unfortunately, the materials used thus far do not produce sufficient effect to improve rate uniformity. Furthermore, the use of certain reactive species, such as silicon, tends to increase the possibility of introducing contamination. Because the annulus is consumable it must be replaced periodically.

It would therefore be a significant advance in the art to provide an apparatus for reducing excess reactive species at the edge of a substrate during etching. It would be a further advance if such an apparatus did not introduce contamination into the fabrication process, and did not increase the difficulty of substrate handling.

SUMMARY OF THE INVENTION

The invention provides an apparatus for reducing excessive reactive species at the edge of a substrate during etching, thereby improving etch rate uniformity across the substrate. A sacrificial gas absorber area that extends beyond the edges of a substrate includes an absorber surface that is at or below the surface of the substrate. In a first preferred embodiment of the invention, the temperature of the gas absorber area is lowered or elevated by standard methods, thereby providing enhanced condensation or recombination of excess reactive species at the substrate edge.

In another equally preferred embodiment of the invention, the gas absorber area is formed of a porous material having a large surface area. Excess reactive species are recombined within the porous structure of the area. The removal of the excess reactive species provides a uniform reactant concentration across the substrate, and thus, a uniform etch rate.

In a third equally preferred embodiment of the invention, a boundary curtain of a laminar inert or reactive gas is emitted from a narrow slot along the perimeter of the substrate to form a diffusive barrier that suppresses the flux of excess reactive species at the substrate's edge.

DETAILED DESCRIPTION OF THE INVENTION

The invention provides an apparatus for reducing the excess reactive species at the edge of a substrate during etching in a process chamber, thereby improving etch rate uniformity over the substrate surface. An exemplary process chamber for etching is described in U.S. Pat. No. 4,842,683 which is hereby incorporated by reference.

Figure 1:
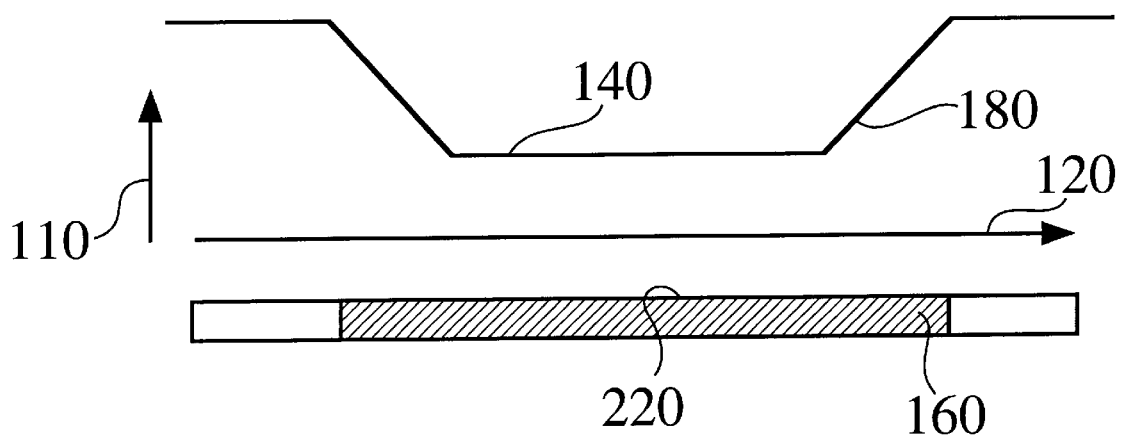
FIG. 1 is a diagram showing the concentration of reactive species during substrate etching relative to the surface of a semicondoutor wafer.
Figure 2:
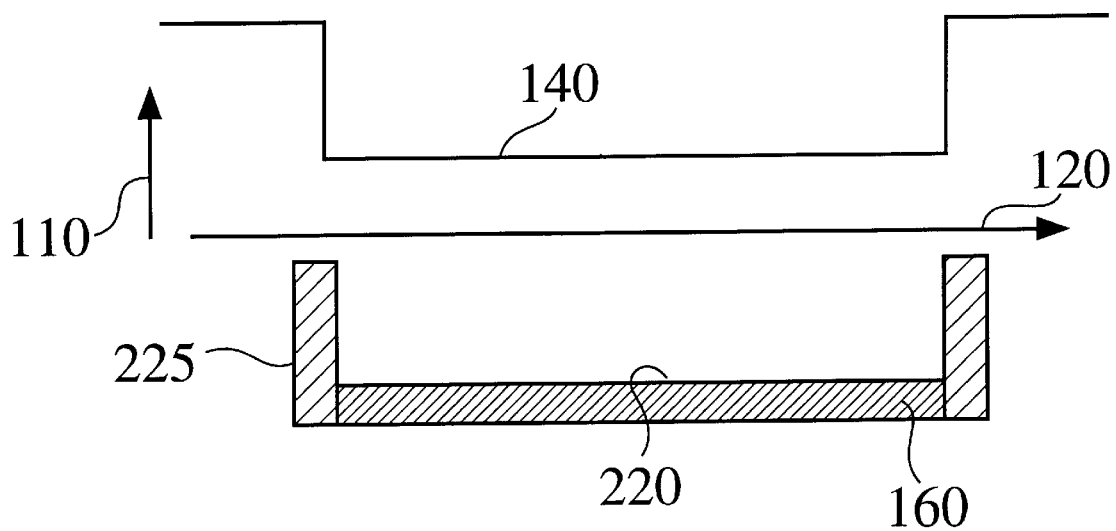
FIG. 2 is a schematic diagram showing the concentration of reactive species during substrate etching with a focus ring as diffusion barrier.
Figure 3:
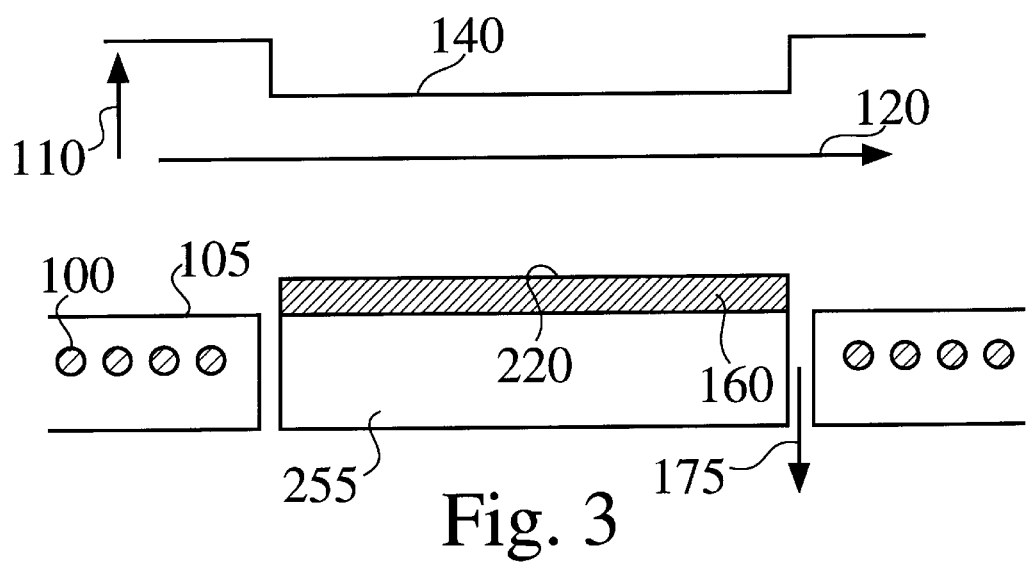
FIG. 3 is a schematic diagram of a near substrate reactant homogenization apparatus according to a first preferred embodiment of the invention.

FIG. 3 is a schematic diagram of a near substrate reactant homogenization apparatus according to a first preferred embodiment of the invention. A near substrate reactant homogenization apparatus has an absorber area 105 that is parallel to, and at or below, the surface of a substrate. In one embodiment of the invention, this absorber area is substantially planar. The surface of the absorber area radially extends beyond the edge 160 of the substrate surface. The radial extent of the absorbing area must be sufficient to confine the region of species non-uniformity to beyond the substrate perimeter. This would, for example, typically require the surface of the absorber area to extend radially approximately a few centimeters beyond the perimeter of a 200 mm substrate.

Because the absorber area is at or below the substrate surface, it does not share the focus ring's drawback of being a source of damaging particles. The absorber area may be at any distance below the substrate surface provided it is not below the substrate lower surface.

In a first preferred embodiment of the invention, the temperature of the gas absorber area is reduced to a temperature consistent with condensation of the reactive species, and should therefore be lower than the substrate temperature. This low temperature enhances condensation of the excess reactive species at the substrate edge. In addition, for certain gases and materials, chemical recombination is enhanced by elevating the temperature of the gas absorbing area.

The temperature level of the gas absorber area is controlled to meet the requirements of the particular etching process. The temperature level of the absorber area is controllably reduced or elevated by means such as a heat channel exchanger 100, or by circulation of a cooled or heated liquid or mixed phase fluid under the absorber area (not shown). In either case, the fluid is thermally isolated from the substrate and substrate platform 255 by vacuum 175 or other isolation means.

The excess reactive species concentration of the non-uniform region is drawn out from the edge of the substrate and over the cooled gas absorber area, where condensation occurs. The uniform region of reactive species extends from the interior of the substrate 220 to encompass the substrate's edge 160.

Alternatively, the gas absorber area is maintained at a reduced temperature that increases the condensation of the excess reactive species on the absorber area surface, or at the elevated temperature to promote recombination. Exemplary temperature ranges are from −100 to 0° C. to promote condensation, and from 50 to 100° to promote recombination. Accordingly, the flux of this material has a uniform distribution over the etching surface, as shown by the lines identified by the numeric designators 110 and 120. Thus, a region of uniformity 140 occurs across the surface of the wafer 220.

Figure 4:
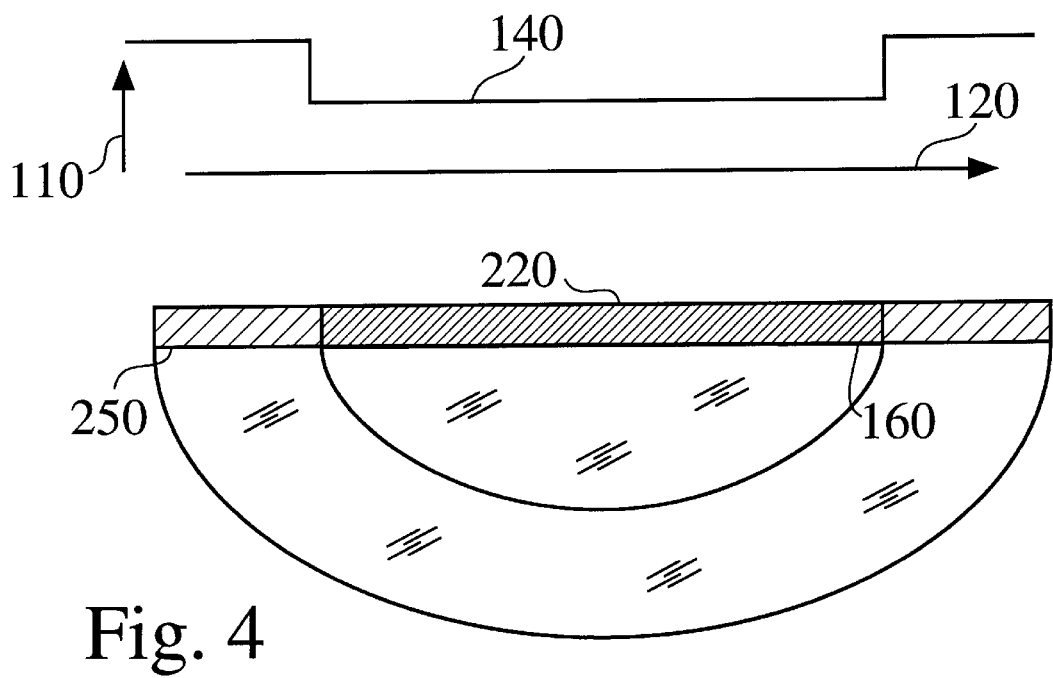
FIG. 4 is a schematic diagram of a near substrate reactant homogenization apparatus according to a second, equally preferred embodiment of the invention.

FIG. 4 is a schematic diagram of a near substrate reactant homogenization apparatus according to a second, equally preferred embodiment of the invention. The gas absorber area is formed of a micro-porous, large surface area material 250. Candidate materials include aluminosilicates, zeolite, and ceramics. Refractory materials are preferred to minimize degradation due to plasma exposure. The pores are preferably between 10 μ and 1 mm in diameter. Excess reactive species enter the porous structure, react at the surface of the pores and convert to non-reactive species. The reduction in reactive species concentration at the edge of the substrate therefore provides a uniform concentration over the substrate, and thus, a uniform etch rate. Accordingly, the flux of this material has a uniform distribution over the etching surface, as shown by the lines identified by the numeric designators 110 and 120. Thus, a region of uniformity 140 occurs across the surface of the wafer 220.

Figure 5:
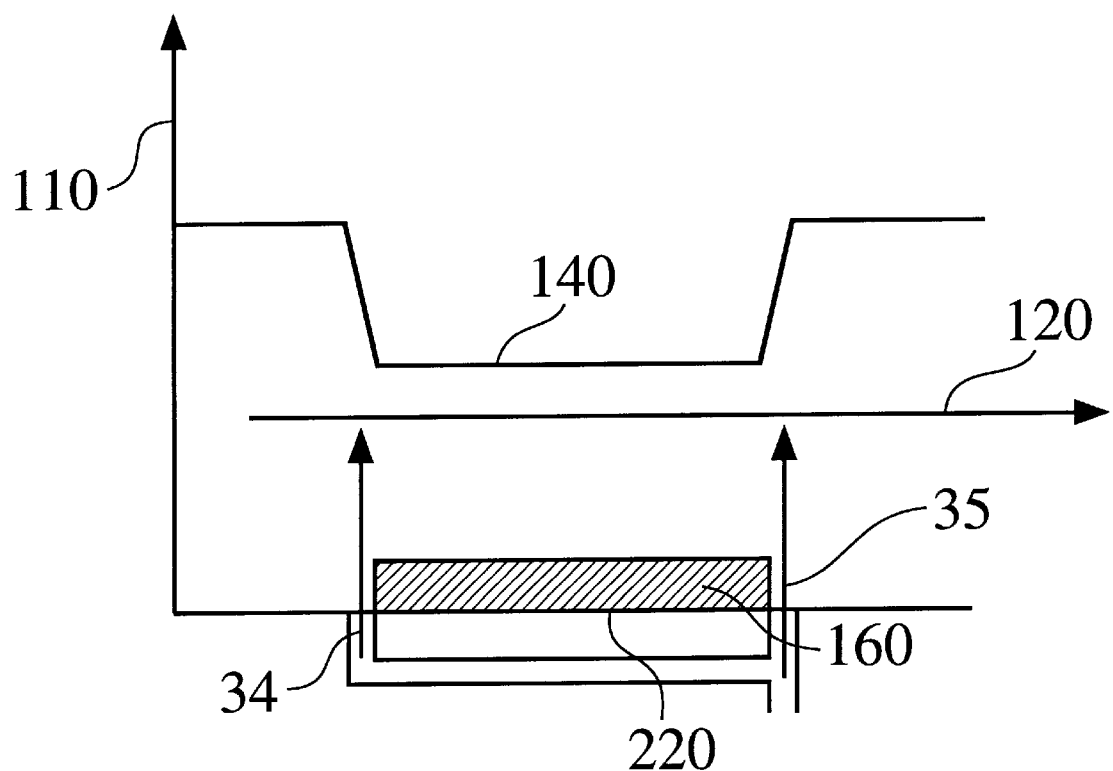
FIG. 5 is a side view of the boundary curtain concept for injection of inert or reactive gases, according to a third equally preferred embodiment of the invention.

In a third, equally preferred embodiment of the invention, shown in FIG. 5, an inert or process gas is introduced through a narrow slot 34 formed around the perimeter of the substrate to form a gas curtain 35. The slot is preferably 0.5 mm to 2 mm in width. This high velocity gas curtain acts as a physical diffusive barrier and should therefore be provided at a flow rate that is sufficient to provide an effective barrier. This rate varies from process to process. The gas curtain is supplied by conventional pumping means as are well known in the art.

Thus, in this embodiment of the invention reactive species are connected vertically away from the substrate before they can diffuse radially across the curtain. Accordingly, the flux of this material has a uniform distribution over the etching surface, as shown by the lines identified by the numeric designators 110 and 120. Thus, a region of uniformity 140 occurs across the surface of the wafer 220.

Although the invention is described herein with reference to the preferred embodiment, one skilled in the art will readily appreciate that other applications may be substituted for those set forth herein without departing from the spirit and scope of the invention. For example, the near substrate reactant homogenization apparatus may be both temperature controlled and formed of a porous large surface area material. Accordingly, the invention should only be limited by the claims included below.

What is claimed is:

1. A method for reducing excess species near an edge of a substrate disposed in a substrate processing chamber, said method comprising:

flowing one or more gases into said substrate processing chamber wherein said one or more gases can be dissociated into reactive species;

performing a substrate processing operation within said chamber that results in consumption of reactive species at an upper surface of said substrate and results in creation of a region of excess species near an edge of said substrate;

trapping said excess species in a gas absorber located within said chamber and surrounding said substrate, said gas absorber being made from a porous material and being positioned within said chamber such that an upper surface of said gas absorber is located coplanar with or below an upper surface of said substrate.

2. The method of claim 1 wherein said porous material is selected from the group of aluminosilicates, zeolite and ceramic materials.

3. The method of claim 2 wherein pores of said porous material are between 10 microns and 1 millimeter in diameter.

4. The method of claim 1 wherein said absorber surface is located above a lower surface of said substrate.

5. The method of claim 4 wherein said absorber surface extends several centimeters beyond a perimeter of said substrate.

6. The method of claim 1 wherein said substrate processing operation is a substrate etching operation.

7. The method of claim 6 wherein said porous material is selected from the group of aluminosilicates, zeolite and ceramic materials.

8. The method of claim 7 wherein pores of said porous material are between 10 microns and 1 millimeter in diameter.

9. The method of claim 6 wherein said absorber surface is located above a lower surface of said substrate.

10. The method of claim 6 wherein said absorber surface extends several centimeters beyond a perimeter of said substrate.

11. A method for etching a substrate having opposed surfaces, said method comprising:

directing a reactive species toward one of said opposed surfaces; and creating a temperature gradient between a periphery of said substrate and a region surrounding said periphery, defining a gradient region.

12. The method as recited in claim 11 wherein said temperature gradient has first and second temperatures associated therewith, with said first temperature being located proximate to said periphery and greater than said second temperature, said second temperature being located spaced-apart from said periphery.

13. The method as recited in claim 11 wherein said temperature gradient has first and second temperatures associated therewith, with said first temperature being located proximate to said periphery and lower than said second temperature, said second temperature being located spaced-apart from said periphery.

14. The method as recited in claim 11 wherein a subportion of said reactive species, proximate to said periphery, is condensed onto said gradient region.

15. The method as recited in claim 11 wherein said reactive species includes a plurality of particles, and a quantity of said reactive species is reduced by recombining a subportion of said plurality of particles located adjacent to said gradient region.

16. The method as recited in claim 11 wherein a subportion of said reactive species, proximate to said periphery, is collected in said gradient region.

17. The method as recited in claim 11 wherein one of said opposed surfaces lies in a first plane and said remaining opposed surface lies in a second plane, with said gradient region being positioned in a region extending between said first and second planes.

18. The method as recited in claim 11 wherein creating a temperature gradient includes maintaining said gradient region at a temperature below a temperature of said substrate.

19. The method as recited in claim 11 wherein creating a temperature gradient includes maintaining said gradient region at a temperature above a temperature of said substrate.

20. An apparatus for etching a substrate, said apparatus comprising:

a housing that forms a chamber;

a substrate support; and a gas absorber surrounding said substrate support, said gas absorber being made from a porous material and having an absorber surface located such that, when a silicon substrate upon which integrated circuits are formed is positioned on said substrate support, said absorber surface is coplanar with or below an upper surface of said substrate.

21. The apparatus of claim 20 wherein said porous material is selected from the group of aluminosilicates, zeolite and ceramic materials.

22. The apparatus of claim 21 wherein pores of said porous material are between 10 microns and 1 millimeter in diameter.

23. The apparatus of claim 20 wherein said absorber surface is located above a lower surface of said substrate.

24. The apparatus of claim 23 wherein said absorber surface extends several centimeters beyond a perimeter of said substrate.

* * * * *